(12) United States Patent
Yoshino et al.

(10) Patent No.: US 10,930,559 B2
(45) Date of Patent: Feb. 23, 2021

(54) METHOD FOR MANUFACTURING SEMICONDUCTOR DEVICE

(71) Applicant: Mitsubishi Electric Corporation, Tokyo (JP)

(72) Inventors: Tatsuro Yoshino, Tokyo (JP); Masato Suzuki, Tokyo (JP); Masato Negishi, Tokyo (JP); Kenji Yoshikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/490,040

(22) PCT Filed: Apr. 12, 2017

(86) PCT No.: PCT/JP2017/014998
§ 371 (c)(1),
(2) Date: Aug. 29, 2019

(87) PCT Pub. No.: WO2018/189835
PCT Pub. Date: Oct. 18, 2018

(65) Prior Publication Data
US 2020/0066590 A1    Feb. 27, 2020

(51) Int. Cl.
*H01L 21/78*    (2006.01)
(52) U.S. Cl.
CPC .................................... *H01L 21/78* (2013.01)
(58) Field of Classification Search
None
See application file for complete search history.

(56) References Cited

U.S. PATENT DOCUMENTS 6,488,021 B1    12/2002   Yamane et al.
2009/0111203 A1   4/2009   Nakamura et al.
(Continued)

FOREIGN PATENT DOCUMENTS

JP    H07-086687 A    3/1995
JP    2001-127369 A   5/2001
(Continued)

OTHER PUBLICATIONS

International Search Report; Written Opinion; and Notification of Transmittal of the International Search Report and the Written Opinion of the International Searching Authority, or the Declaration issued in PCT/JP2017/014998; dated May 23, 2017.
(Continued)

*Primary Examiner* — Asok K Sarkar
(74) *Attorney, Agent, or Firm* — Studebaker & Brackett PC

(57) ABSTRACT

A method includes a step of forming a plurality of semiconductor devices having active regions, in a wafer, a step of forming a plurality of cleavage grooves on an upper surface side of the wafer, and a step of cleaving the wafer from the upper surface side of the wafer to expose steps formed by the plurality of cleavage grooves, and the plurality of active regions, on a sectional surface, wherein the active region is provided in a semicircle that has a radius that is a distance from a bottom of the cleavage groove to a lower surface of the wafer, and has a center that is on the lower surface of the wafer and is immediately below the cleavage groove in a cleavage propagation direction.

8 Claims, 8 Drawing Sheets

(56) References Cited

U.S. PATENT DOCUMENTS

| | | | |
|---|---|---|---|
| 2013/0065335 A1* | 3/2013 | Motoda | H01S 5/0202 |
| | | | 438/33 |
| 2013/0122693 A1 | 5/2013 | Anzue et al. | |
| 2015/0118827 A1* | 4/2015 | Watatani | H01L 21/78 |
| | | | 438/462 |
| 2018/0145206 A1* | 5/2018 | Yoshikawa | B28D 5/0011 |
| 2020/0111709 A1* | 4/2020 | Yoshikawa | H01S 5/00 |

FOREIGN PATENT DOCUMENTS

| | | |
|---|---|---|
| JP | 2009-111268 A | 5/2009 |
| WO | 2006/041134 A1 | 4/2006 |
| WO | 2017/006902 A1 | 1/2017 |

OTHER PUBLICATIONS

Office Action issued in JP 2017-533640; mailed by the Japanese Patent Office dated Jul. 18, 2017.

* cited by examiner

METHOD FOR MANUFACTURING SEMICONDUCTOR DEVICE

FIELD

The present invention relates to a method for manufacturing a semiconductor device that has an active region.

BACKGROUND

Semiconductor devices having active regions from which light is emitted are formed on a wafer, and then the wafer is cleaved. By exposing active regions through cleaving, an optically flat surface can be achieved. As for cleavage, it is preferable that the wafer be divided along a cleavage reference line that is an ideal cleavage line. However, for example, in a case where the process patterns of multiple semiconductor devices are formed inclined from the cleavage reference line, deviations occur between the patterns and the cleavage reference line, and the cleavage line deviates from the cleavage reference line. If the cleavages deviating largely from the cleavage reference line frequently occur, the semiconductor device production yield ratio decreases.

Patent Literature 1 discloses providing pattern electrodes on a semiconductor laminated body in which a plurality of semiconductor layers including an active layer are laminated, forming multiple grooves for cleavage that are parallel to each other for the pattern electrodes by an etching process, and subsequently performing first cleaving in the direction orthogonal to each groove for cleavage, thereby forming a bar-like element joint body.

PRIOR ART

Patent Literature

Patent Literature 1: JP 2001-127369 A

SUMMARY

Technical Problem

According to the technique of Patent Literature 1, by correcting the cleavage development direction by means of the grooves for cleavage, a step is formed on a sectional surface appearing by cleavage. The step extends from the groove for cleavage in the cleavage propagation direction and reaches the rear surface of the wafer. There is a problem in that if the step reaches an active region from which light is radiated, the light emission direction of a semiconductor device is changed, and the light emission efficiency is reduced. To prevent the step from reaching the active region, each groove for cleavage is required to be provided at a position sufficiently apart from the active region. However, this limits the number and formation positions of grooves for cleavage.

The present invention has been made to solve the problem described above, and has an object to provide a method for manufacturing a semiconductor device that can prevent the step developing from the cleavage groove from reaching the active region without any adverse effect.

Means for Solving the Problems

In some examples, a method for manufacturing a semiconductor device includes a step of forming a plurality of semiconductor devices having active regions, in a wafer, a step of forming a plurality of cleavage grooves on an upper surface side of the wafer, and a step of cleaving the wafer from the upper surface side of the wafer to expose steps formed by the plurality of cleavage grooves, and the plurality of active regions, on a sectional surface, wherein the active region is provided in a semicircle that has a radius that is a distance from a bottom of the cleavage groove to a lower surface of the wafer, and has a center that is on the lower surface of the wafer and is immediately below the cleavage groove in a cleavage propagation direction.

In some examples, a method for manufacturing a semiconductor device includes a step of forming a plurality of semiconductor devices having active regions, in a wafer, a step of forming a plurality of cleavage grooves on a lower surface side of the wafer, and a step of cleaving the wafer from the lower surface side of the wafer to expose steps formed by the plurality of cleavage grooves, and the plurality of active regions, on a sectional surface, wherein the active region is formed at a position that does not overlap the step.

In some examples, a method for manufacturing a semiconductor device includes a step of forming a plurality of semiconductor devices having active regions, in a wafer, a step of forming a plurality of structures on an upper surface side or a lower surface side of the wafer, and a step of exposing steps formed by the plurality of structures, and the plurality of active regions, on a sectional surface, by cleaving the wafer from an upper surface side of the wafer in a case where the plurality of structures are formed on the upper surface side of the wafer, and cleaving the wafer from the lower surface side of the wafer in a case where the plurality of structures are formed on the lower surface side, wherein the active region is formed at a position that does not overlap the step.

In some examples, a method for manufacturing a semiconductor device includes a step of forming a plurality of semiconductor devices having active regions, in a wafer, a step of forming a plurality of structure groups or a plurality of cleavage groove groups, on an upper surface side of the wafer, and a step of cleaving the wafer from the upper surface side of the wafer to expose steps formed by the plurality of structure groups or the plurality of cleavage groove groups, and the plurality of active regions, on a sectional surface, wherein the one active region is provided on a side of cleavage propagation with respect to the one step.

Other features of the present invention will become apparent from the following description.

Advantageous Effects of Invention

According to the present invention, for example, by providing an active region immediately below the cleavage groove, the step developing from the cleavage groove can be prevented from reaching the active region without any adverse effect.

DESCRIPTION OF EMBODIMENTS

Methods for manufacturing a semiconductor device according to embodiments are described with reference to the drawings. The same or corresponding configuration elements are assigned the same signs, and redundant description is omitted in some cases.

Embodiment 1

Figure 1:
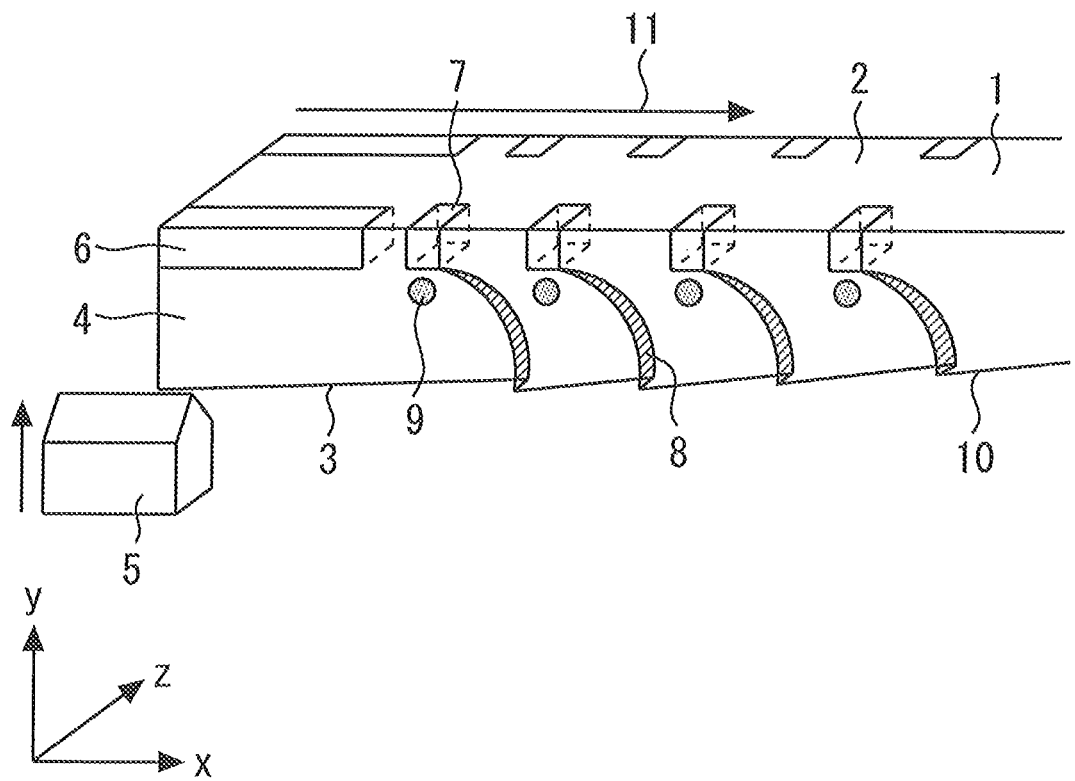
FIG. 1 is a perspective view showing a method for manufacturing a semiconductor device according to Embodiment 1.

FIG. 1 is a perspective view showing a method for manufacturing a semiconductor device according to Embodiment 1. FIG. 1 is a diagram mainly showing a wafer during cleaving. A wafer before being cleaved is also described using this diagram. First, multiple semiconductor devices having active regions 9 are formed in a wafer 1. This step is called a device formation step. One active region 9 resides in one semiconductor device. The active region 9 is a region extending in the z direction in FIG. 1. By the device formation step, multiple semiconductor devices are formed in the wafer 1.

Figure 2:
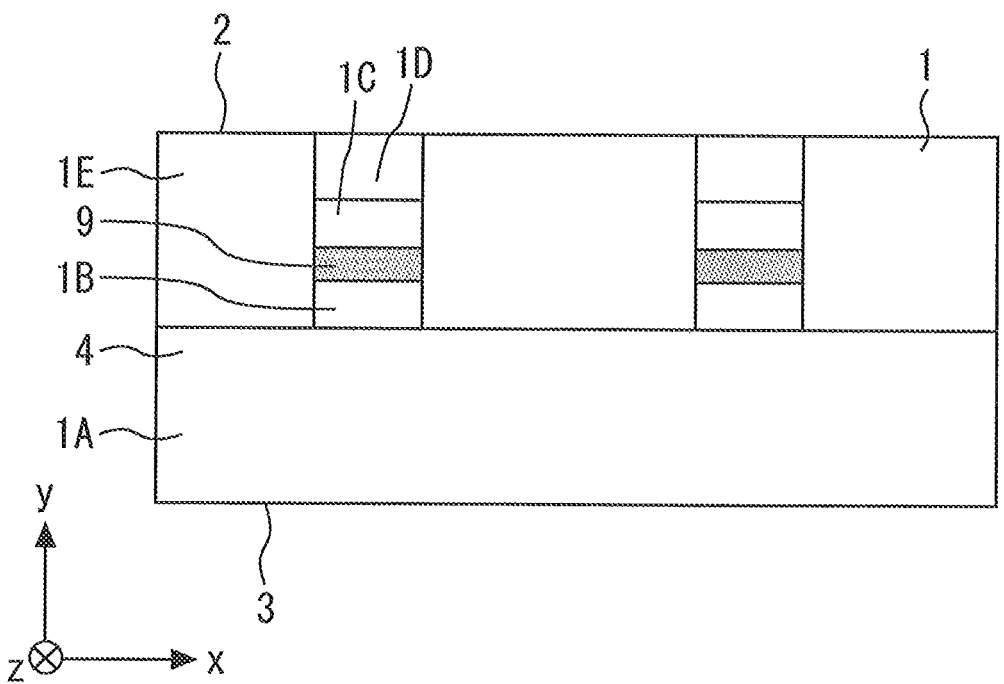
FIG. 2 is a partial sectional view of the wafer after the device formation step.

FIG. 2 is a partial sectional view of the wafer after the device formation step. The wafer 1 includes a substrate 1A made of an n-type InP material, for example. Lower clad layers 1B made of a material of an n-type InP material, for example, are formed on the substrate 1A. Active regions 9 formed of InGaAlAs-MQW, for example, are formed on the respective lower clad layers 1B. The active region 9 is a region that emits light.

Upper clad layers 1C made of a material of a p-type InP material, for example, are formed on the respective active regions 9. Contact layers 1D made of a p-type InGaAs material, for example, are formed on the respective upper clad layers 1C. A semi-insulating film 1E formed of a semi-insulating InP, for example, is formed on a side of the structure consisting of the lower clad layer 1B, the active region 9, the upper clad layer 1C and the contact layer 1D. The semiconductor device is not limited to that having this configuration. Any configuration including the active region 9 that emits light can be adopted as that of the semiconductor device. For example, the semiconductor device may be a semiconductor laser or a light-emitting diode.

The wafer 1 has an upper surface 2 and a lower surface 3. The wafer 1 in FIG. 2 is completed by forming each layer on the substrate 1A by a publicly known semiconductor process, such as a film forming process and an etching process.

Figure 3:
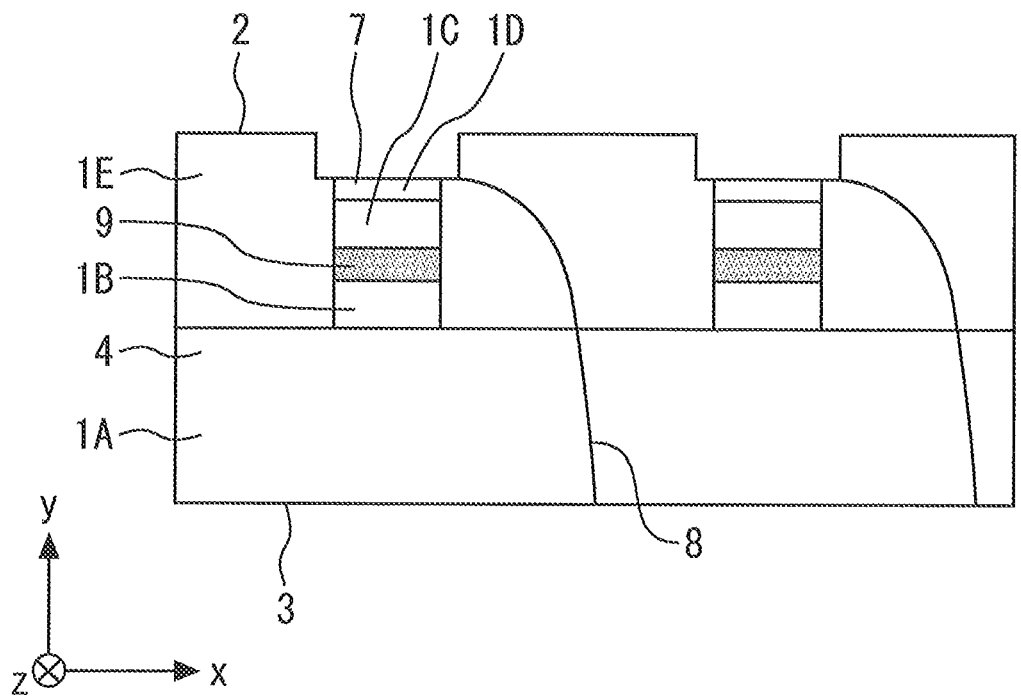
FIG. 3 is a partial sectional view of the wafer showing the cleavage grooves.

Next, multiple cleavage grooves are formed on the upper surface 2 of the wafer 1. This step is called a cleavage groove formation step. FIG. 3 is a partial sectional view of the wafer 1 showing the cleavage grooves 7. The cleavage grooves 7 are formed immediately above the respective active regions 9. Accordingly, the active regions 9 reside immediately below the respective cleavage grooves 7. The cleavage groove 7 is formed in the layers formed on the substrate 1A. For example, the cleavage groove 7 is formed in the contact layer 1D and the semi-insulating film 1E. One cleavage groove 7 is formed for one active region 9. The cleavage grooves 7 can be formed by dry etching or wet etching, for example. The cleavage grooves 7 do not indicate spaces but indicate portions provided with depressions.

The cleavage line may sometimes develop deviating from a cleavage reference line that is an ideal cleavage line. To correct such deviation, the cleavage grooves 7 are provided. Accordingly, the cleavage grooves 7 are required to guide the cleavage line to the cleavage reference line. The cleavage often develops along a corner of the bottom of the cleavage groove 7. Accordingly, it is preferable to provide the corner on the cleavage reference line. Only if the corner of the bottom of the cleavage groove 7 can coincide with the cleavage reference line, the shape of the cleavage groove 7 is not specifically limited. That is, the cleavage groove 7 in FIG. 1 is a rectangle in a plan view. Alternatively, this may be a triangle or a pentagon.

FIG. 1 shows the cleavage grooves 7. In this embodiment, the cleavage groove 7 is a rectangular groove extending in the z direction in the plan view. The cleavage development direction is the x positive direction. Cleavage starting points 6, which serve as a starting point of cleavage, are formed on the upper surface 2 of the wafer 1. In the x positive direction of the cleavage starting point 6, the multiple cleavage grooves 7 are arranged in the x direction.

Next, the wafer is cleaved. This step is called a cleaving step. In the cleaving step, as shown in FIG. 1, a blade 5 is pressed onto the lower surface 3 of the wafer 1 to apply a load to the wafer 1, and the wafer 1 is cleaved from the upper surface 2 of the wafer 1. An arrow 1 indicates the cleavage propagation direction. The fact that the arrow 11 is nearer to the upper surface 2 of the wafer 1 indicates that the cleavage develops from the upper surface of the wafer 1. The wafer 1 is cleaved from the cleavage starting point 6. The cleavage develops in the y negative direction while developing in the x positive direction. Here, the cleavage using the blade 5 is described. However, only if the cleavage can develop from the upper surface 2 of the wafer, another method may be adopted. For example, a crack may be caused by irradiating the wafer 1 with laser, thereby dividing the wafer.

For example, in a case where multiple semiconductor devices are fabricated inclined from the cleavage reference line, the cleavage line of the wafer 1 largely deviates from the cleavage reference line, and the production yield ratio decreases. The cause of deviation between the cleavage line and the cleavage reference line may be process pattern deviations of multiple semiconductor devices in a photolithography step.

Accordingly, in Embodiment 1, to cause the cleavage line to approach the cleavage reference line, multiple cleavage grooves 7 are provided along the cleavage reference line. The stress during cleaving tends to be applied to the cleavage groove 7. Accordingly, a cleavage line 10 of the wafer 1 is corrected toward the cleavage reference line. When the cleavage line 10 of the wafer 1 is corrected to the cleavage reference line, a step 8 is formed on a sectional surface 4. The step 8 occurs from the cleavage groove 7 in the cleavage propagation direction indicated by the arrow 11. FIG. 1 shows that as a result of cleaving, the steps 8 formed by the multiple cleavage grooves 7 and the multiple active regions 9 are exposed on the sectional surface 4. The active regions 9 and the steps 8 do not overlap each other. The end surfaces of all the active regions 9 are flat. According to this cleaving step, laser bars are formed. Subsequently, semiconductor devices are completed by cleaving the laser bars along the z direction.

Figure 4:
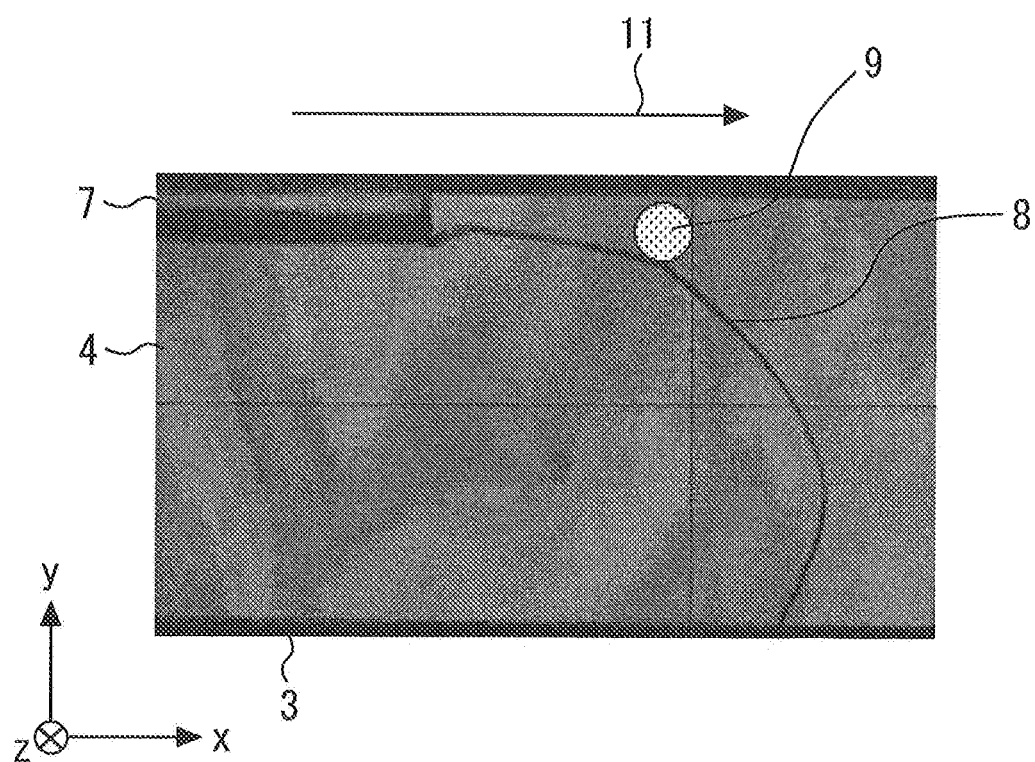
FIG. 4 is a partial sectional view of the wafer that appears by cleavage according to the comparative example.

Here, to facilitate understanding of the meaning of the method for manufacturing a semiconductor device according to Embodiment 1, a comparative example is described. FIG. 4 is a partial sectional view of the wafer that appears by cleavage according to the comparative example. The step 8 develops from the bottom of the cleavage groove 7 in the cleavage propagation direction indicated by the arrow 11, and reaches the lower surface 3 of the wafer 1. The step 8 has a shape similar to a sector. By occurrence of the step 8, the sectional surface 4 of the wafer is corrected from the deviating position toward the cleavage reference line.

The active region 9 in the comparative example has the same height as the cleavage groove 7, and is formed in the cleavage propagation direction with respect to the cleavage groove 7. Accordingly, there is a possibility that the active region 9 reaches the step 8. It is concerned that if the step 8 occurs in the active region 9, the laser light emission efficiency decreases. To avoid occurrence of the step 8 in the active region 9 in the structure of the comparative example, the cleavage groove 7 is required to be sufficiently apart from the active region 9. In this case, the total number and the places of cleavage grooves 7 that can be formed in one semiconductor device are limited. The active region 9 is a region having a width of about 10 μm. Accordingly, there is a high possibility that if the step 8 extends from its originating site in two directions on the upper surface 2, the step 8 is formed in the active region 9. To prevent the step 8 from being formed in the active region 9 even though the step 8 extends its originating site in the two directions on the upper surface 2, the groove depth of the cleavage groove 7 is required to be large. If the depth of the cleavage groove 7 is configured to be large, it is difficult to control the groove bottom shape. If the groove bottom shape cannot be correctly controlled, an intended effect of correcting the cleavage line cannot be obtained.

On the contrary, in Embodiment 1 of the present invention, the cleavage groove 7 is formed on the immediately above the active region 9. Accordingly, even if the step 8 develops in any form from the bottom of the cleavage groove 7, the step 8 can be prevented from reaching the active region 9. Furthermore, unlike the comparative example, the cleavage groove 7 is not required to be sufficiently apart from the active region 9. Accordingly, the flexibility of the formation position of the cleavage groove 7 can be improved. The depths and the intervals of the cleavage grooves 7 are not specifically limited only if being in a range where the cleavage grooves 7 are not in contact with the active regions 9. The length of the cleavage groove 7 in the x direction is not specifically limited only if having a degree of allowing the step 8 to occur.

Figure 5:
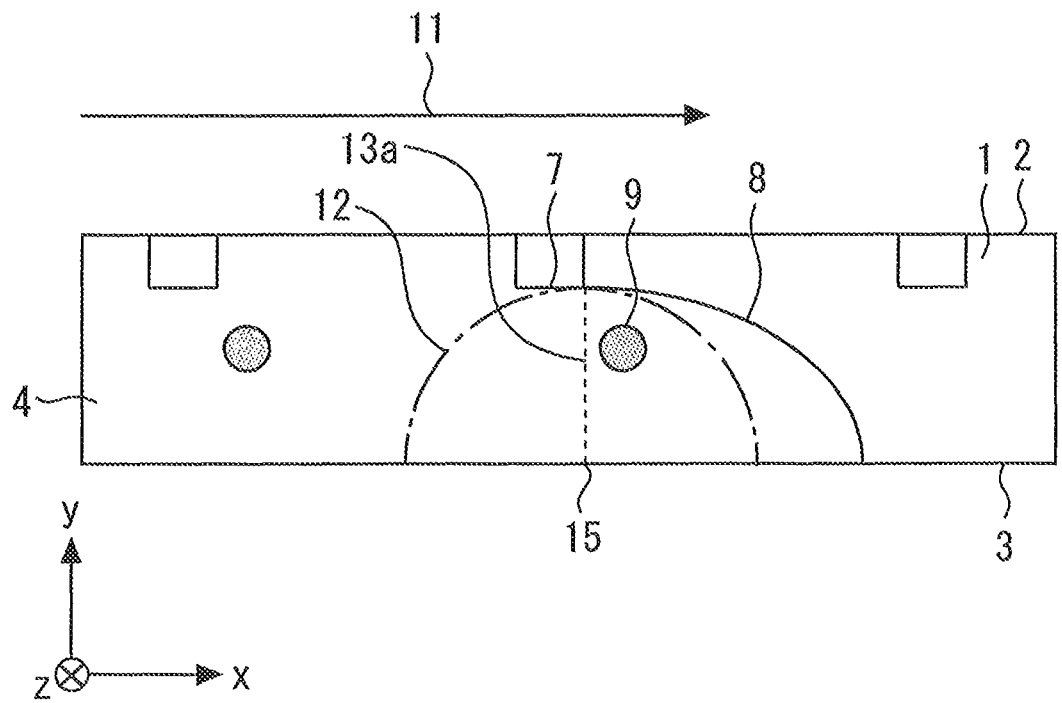
FIG. 5 shows a part of the sectional surface of the wafer that appears by cleavage.

The method for manufacturing a semiconductor device according to Embodiment 1 can be variously modified in a range without losing the characteristics. For example, the cleavage groove 7 is thus provided immediately above the active region 9, but may be provided at another position. FIG. 5 shows a part of the sectional surface 4 of the wafer that appears by cleavage. A semicircle 12 indicated by a chain line indicates a range where the active region 9 can reside. The radius 13a of the semicircle 12 is equal to the distance from the bottom of the cleavage groove 7 to the lower surface 3 of the wafer 1. The center 15 of the semicircle 12 is on the lower surface 3 of the wafer 1 immediately below the end of the cleavage groove 7 in the cleavage propagation direction. By providing an active region 9 so as to be accommodated in the semicircle 12 defined as described above, the step 8 developing from the cleavage groove 7 can be prevented from reaching the active region 9.

The wafer 1 includes, sequentially from the lower surface: the substrate 1A; the lower clad layer 1B; the active region 9; the upper clad layer 1C; and the contact layer 1D. Every configuration included in publicly known laser device can be formed on the wafer 1. In FIG. 1, electrodes are omitted. However, it is preferable that electrodes be formed at positions not appearing on the cleavage surface so as not to affect the development of the cleavage line. Such modification can be applied to the method for manufacturing a semiconductor device according to the following embodiment. The methods for manufacturing a semiconductor device according to the following embodiment have many common points. Accordingly, differences from Embodiment 1 are mainly described.

Embodiment 2

Figure 6:
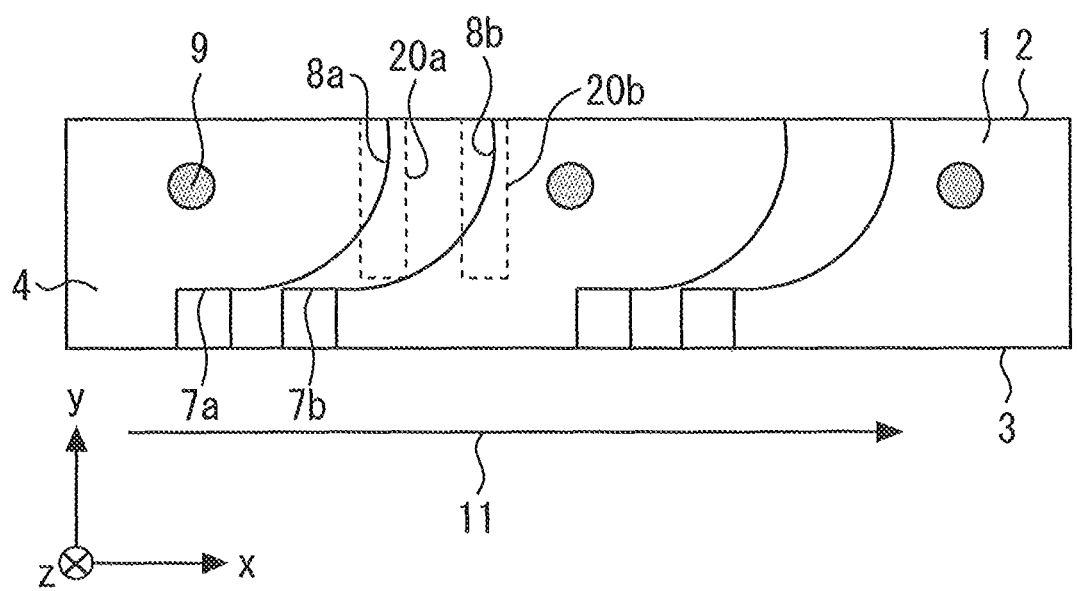
FIG. 6 shows a part of the sectional surface of the wafer that appears by cleavage according to Embodiment 2.

FIG. 6 shows a part of the sectional surface 4 of the wafer 1 that appears by cleavage according to Embodiment 2. The method for manufacturing a semiconductor device according to Embodiment 2 provides cleavage grooves 7a and 7b on the lower surface 3 of the wafer 1 to correct the cleavage line. In Embodiment 2, in the cleavage groove formation step, multiple cleavage grooves are formed on the lower surface 3 of the wafer 1. In one semiconductor device defined by the region formed in one active region 9, two cleavage grooves 7a and 7b are formed, for example. For one semiconductor device, one cleavage groove may be provided, or three or more cleavage grooves may be provided. At any rate, the cleavage groove is formed on the lower surface 3 of the wafer 1.

In the cleaving step, the wafer 1 is cleaved from the lower surface 3 of the wafer 1. For example, the blade is pressed onto the upper surface 2 of the wafer 1 to develop the cleavage from the lower surface 3 of the wafer 1. The fact that the arrow 11 indicating the cleavage propagation direction is nearer to the lower surface 3 of the wafer 1 indicates that the cleavage propagates from the lower surface 3 of the wafer 1. Accordingly, the starting point of the cleavage is on the lower surface 3. The cleavage develops in the y positive direction while developing in the x positive direction. By cleaving, steps 8a and 8b formed by the multiple cleavage grooves 7a and 7b, and the multiple active regions 9 are exposed on the sectional surface 4. The active regions 9 are formed at positions without overlapping with the steps 8.

The active region 9 is formed at a position nearer to the upper surface 2 than the lower surface 3 of the wafer. Accordingly, if the cleavage groove is provided on the upper surface 2 of the wafer 1, the distance between the cleavage groove and the active region 9 is shorter than that in a case where the cleavage groove is provided on the lower surface 3 of the wafer 1. The step 8 develops mainly in the cleavage propagation direction, and subsequently, mainly develops orthogonally to the cleavage propagation direction. Accordingly, if the cleavage groove is close to the active region 9, the step 8 tends to reach the active region 9. In other words, in Embodiment 1, the cleavage groove 7 and the active region 9 are formed on the upper surface 2 of the wafer 1 and the heights of both are substantially the same. Accordingly, the step 8 tends to develop mainly in the cleavage propagation direction at the height where the active region 9 resides.

On the contrary, in Embodiment 2, the cleavage grooves 7a and 7b are formed on the lower surface 3 of the wafer 1. Accordingly, as understood as from FIG. 6, at the height where the active regions 9 reside, the steps 8a and 8b mainly develops perpendicularly to the cleavage propagation direction. Consequently, it is easy to prevent the steps 8a and 8b from reaching the active regions 9. Specifically, the active regions 9 may be provided at any place only if a region 20a where the step 8a develops in the y positive direction perpendicular to the cleavage propagation direction, and a region 20b where the step 8b develops in the y positive direction perpendicular to the cleavage propagation direction are kept off. Consequently, the active regions 9 can be arranged on generally all the regions adjacent to the upper surface 2 of the wafer 1.

Consequently, by providing the cleavage grooves 7a and 7b on the lower surface 3 of the wafer 1 to increase the distance between the active region 9 and the cleavage groove, the limitation to places where the active regions 9 are formed can be significantly alleviated. Consequently, the cleavage grooves can be closer to each other and the density of the cleavage grooves can be more increased than those in Embodiment 1. By increasing the number of cleavage grooves that are formed per unit length in the cleavage propagation direction, the advantageous effect of correcting the cleavage line can be improved.

Embodiment 3

Figure 7:
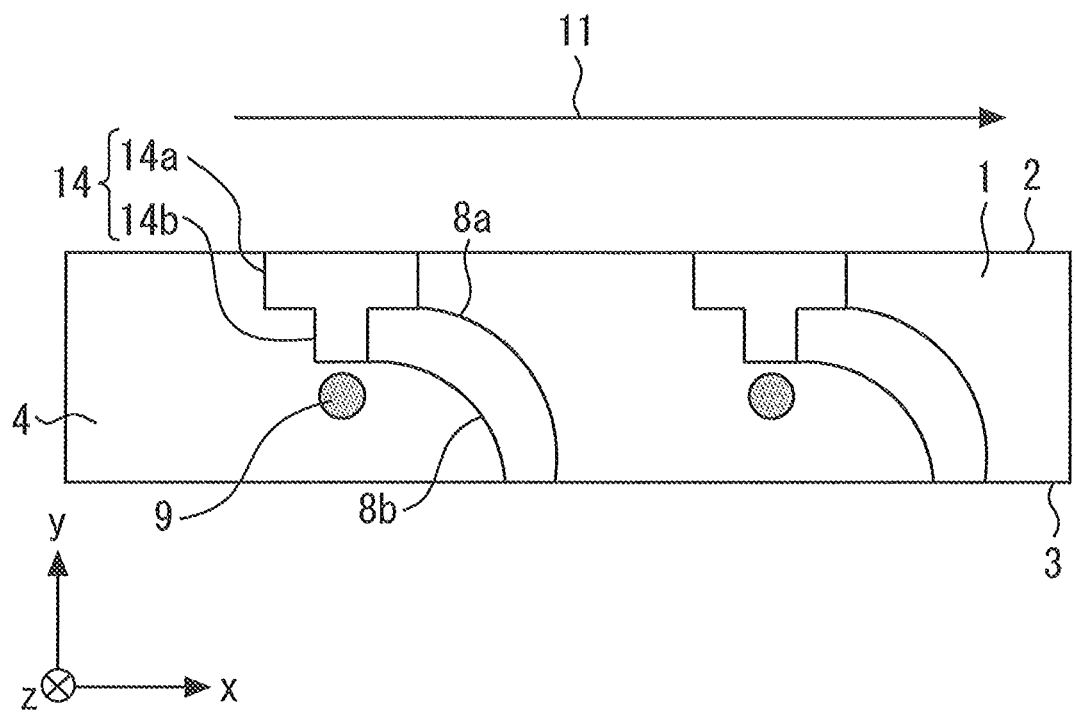
FIG. 7 shows a part of the sectional surface of the wafer that appears by cleavage according to Embodiment 3.

FIG. 7 shows a part of the sectional surface 4 of the wafer 1 that appears by cleavage according to Embodiment 3. On the upper surface 2 of the wafer 1, cleavage grooves 14 are formed. The cleavage groove 14 has a shape having a width that becomes narrower in a stepwise manner in the depth direction. Specifically, the cleavage groove 14 includes a first groove 14a having a wide width, and a second groove 14b having a width narrower than the first groove 14a formed on the bottom surface of the first groove 14a. In the wafer 1, the cleavage grooves 14 can be fabricated by applying dry etching or wet etching, for example. For example, the cleavage grooves 14 can be formed at the same time of a process, such as formation of an optical waveguide, for example. The interval and the number of steps of the cleavage grooves 14 are not specifically limited. Preferably, the active regions 9 are provided immediately below the respective second grooves 14b.

Figure 8:
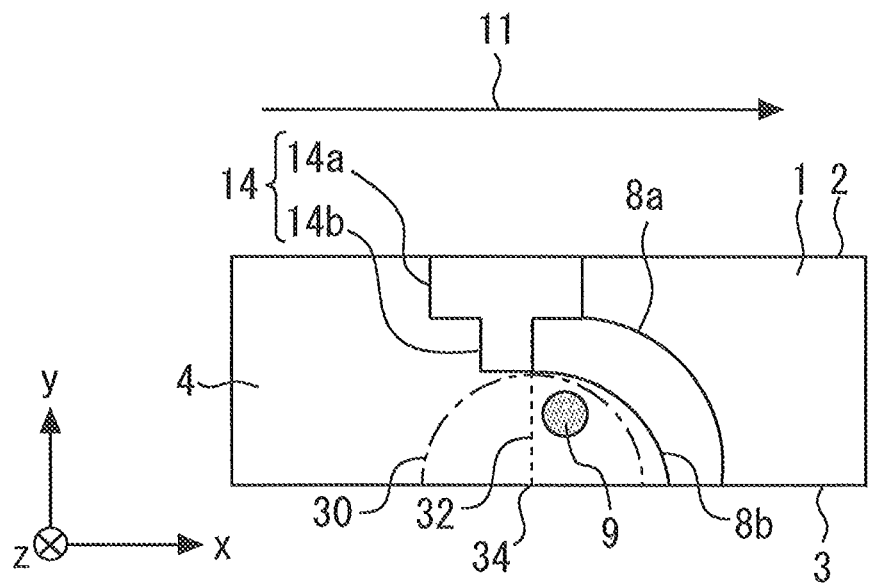
FIG. 8 shows a region where the active region can reside.

The step 8a occurs from the starting point that is the first groove 14a. The step 8b occurs from the starting point that is the second groove 14b. Because the active regions 9 are provided immediately below the cleavage grooves 14, the steps 8a and 8b can be prevented from reaching the active regions 9. FIG. 8 shows a region where the active region 9 can reside. The radius 32 of the semicircle 30 is equal to the distance from the bottom of the cleavage groove 14 to the lower surface 3 of the wafer 1. The center 34 of the semicircle 30 is on the lower surface 3 of the wafer 1 immediately below the end of the cleavage groove 14 in the cleavage propagation direction at a position with the narrowest width. By providing an active region 9 so as to be accommodated in the semicircle 30 defined as described above, the step developing from the cleavage groove can be prevented from reaching the active region 9.

Furthermore, by making the cleavage groove 14 having a stepwise shape as described above, the number of steps that occur from one cleavage groove 14 can be increased. Increase in the number of steps can improve the advantageous effect of correcting the cleavage line toward the cleavage reference line. Consequently, in comparison with Embodiment 1, the cleavage line is allowed to approach the cleavage reference line.

The shape of the cleavage groove 14 is not specifically limited only if the shape has a width narrower in the depth direction. For example, in addition to the first groove 14a and the second groove 14b, a third groove having a width narrower than that of the second groove 14b may be formed on the bottom surface of the second groove 14b. In this case, three steps are provided by the three grooves. The number of grooves may further be increased.

Figure 9:
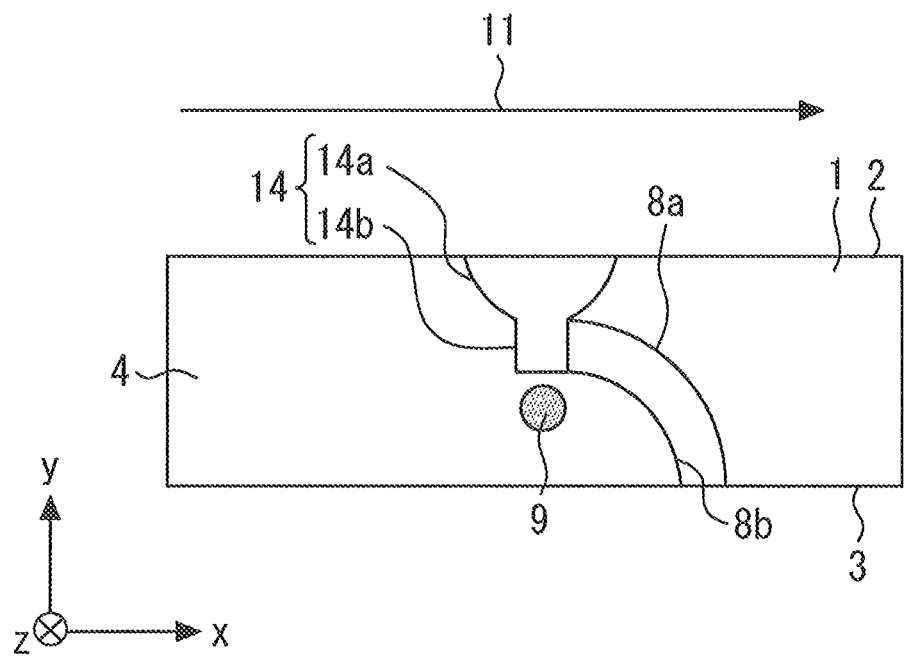
FIG. 9 shows a part of the sectional surface that appears by cleavage according to a modified example.

FIG. 9 shows a part of the sectional surface 4 that appears by cleavage according to a modified example. The side surfaces of the first groove 14a are curved surfaces. As described above, the side surfaces of the cleavage groove may be formed as curved surfaces at least partially. The depths and the intervals of the cleavage grooves 14 are not specifically limited only if being in a range where the cleavage grooves 14 are not in contact with the active regions 9.

Figure 10:
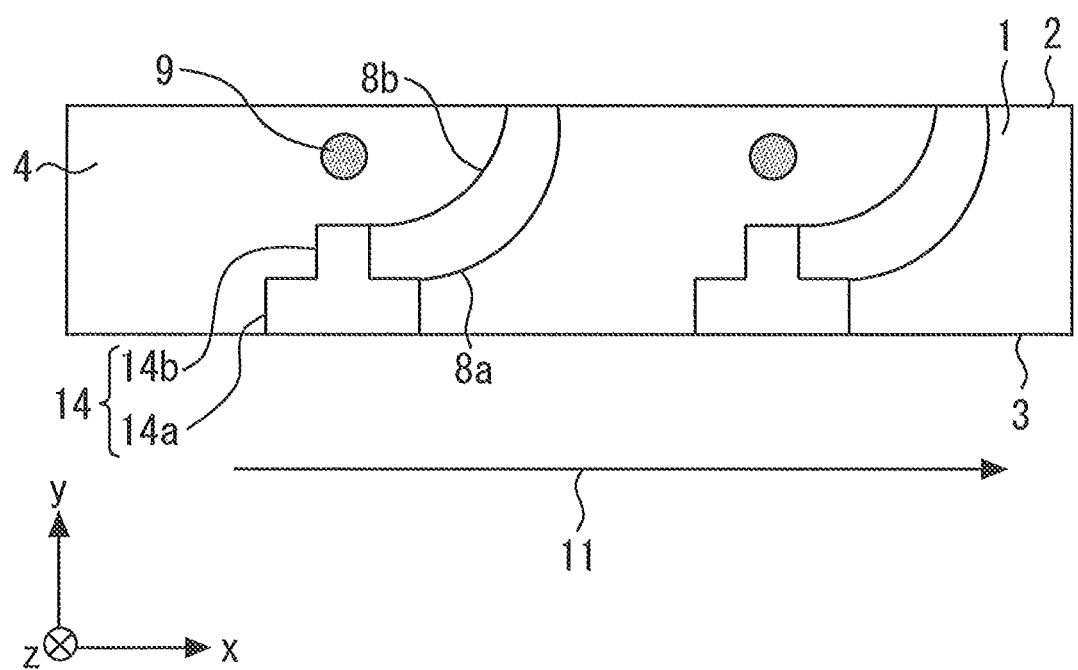
FIG. 10 shows a part of the sectional surface that appears by cleavage according to another modified example.
Figure 11:
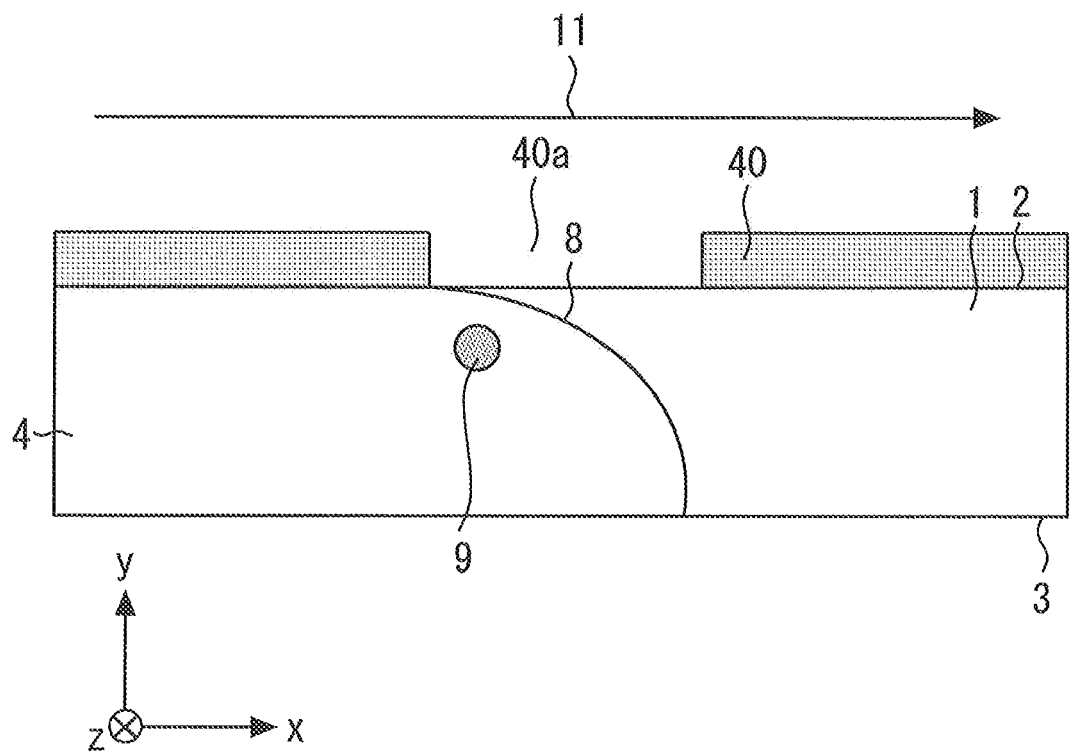
FIG. 11 shows a part of the sectional surface of the wafer that appears by cleavage according to Embodiment 4.

FIG. 10 shows a part of the sectional surface 4 that appears by cleavage according to another modified example. The stepwise cleavage grooves 14 are formed on the lower surface 3 of the wafer 1. The cleavage groove 14 has a width that becomes narrower in the stepwise manner in the depth direction. Accordingly, the number of steps can be increased while preventing the steps from reaching the active regions 9. The cleavage groove may have a shape of becoming narrower in the depth direction, and is not necessarily stepwise. The side surfaces of the cleavage groove may be formed as curved surfaces at least partially.

Embodiment 4

FIG. 1 shows a part of the sectional surface 4 of the wafer 1 that appears by cleavage according to Embodiment 4. The method for manufacturing a semiconductor device according to Embodiment 4 does not form the cleavage grooves after the device formation step, but forms multiple structures 40 on the upper surface 2 of the wafer 1. For example, the structures 40 are formed by forming metal or an insulating film on the upper surface 2 of the wafer 1. The structures 40 can be formed by sputtering or a deposition method, for example.

In the cleaving step, by cleaving the wafer 1 from the upper surface 2 of the wafer 1, the step 8 develops from the corner of the bottom surface of the structure 40, and reaches the lower surface 3 of the wafer 1. By occurrence of the step 8, the cleavage line can be corrected toward the cleavage reference line. After the cleaving step is completed, the steps 8 formed by the structures 40, and the multiple active regions 9 are exposed on the sectional surface 4. The active regions 9 are formed at positions without overlapping with the steps 8.

Figure 12:
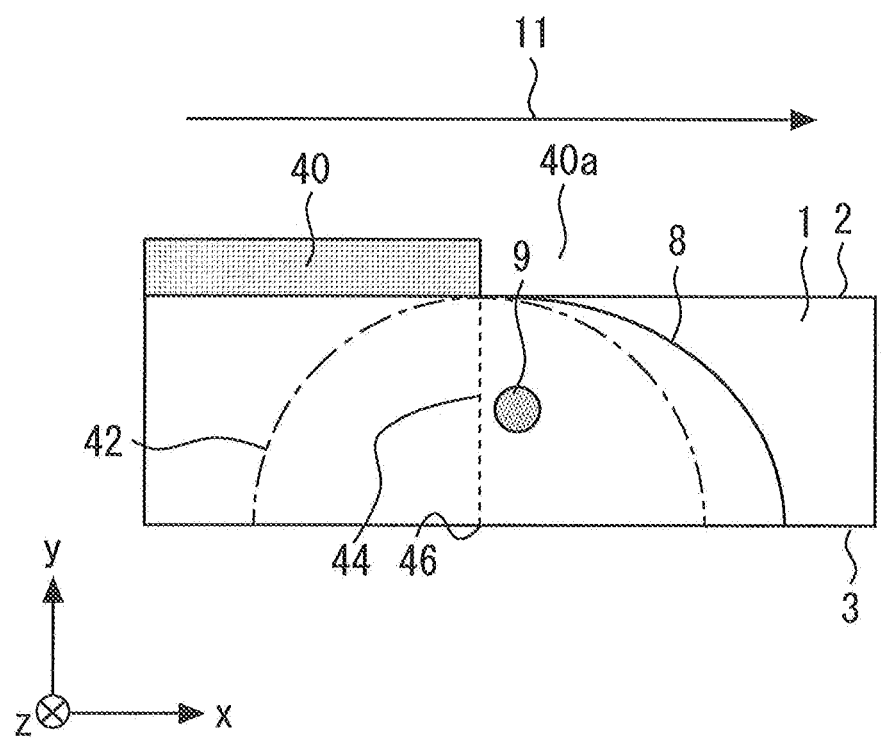
FIG. 12 shows a region where the active region can be provided.

FIG. 12 shows a region where the active region 9 can be provided. A semicircle 42 indicates a region where the active region 9 can reside. The radius 44 of the semicircle 42 is equal to the thickness of the wafer 1. The center 46 of the semicircle 42 is on the lower surface 3 of the wafer 1 immediately below the end of the structure 40 in the cleavage propagation direction. By providing the active region 9 in the semicircle 42, the step 8 that develops by the structure 40 can be prevented from reaching the active region 9.

The structure 40 is provided as means for forming the step 8. By providing the structure 40, the step 8 can be introduced without application of a process to the wafer 1. On the upper surface 2 of the wafer 1, electrodes partially reside but wide spaces for allowing the structures 40 to be formed reside. Consequently, the structures 40 having any shape can be formed.

Embodiment 5

Figure 13:
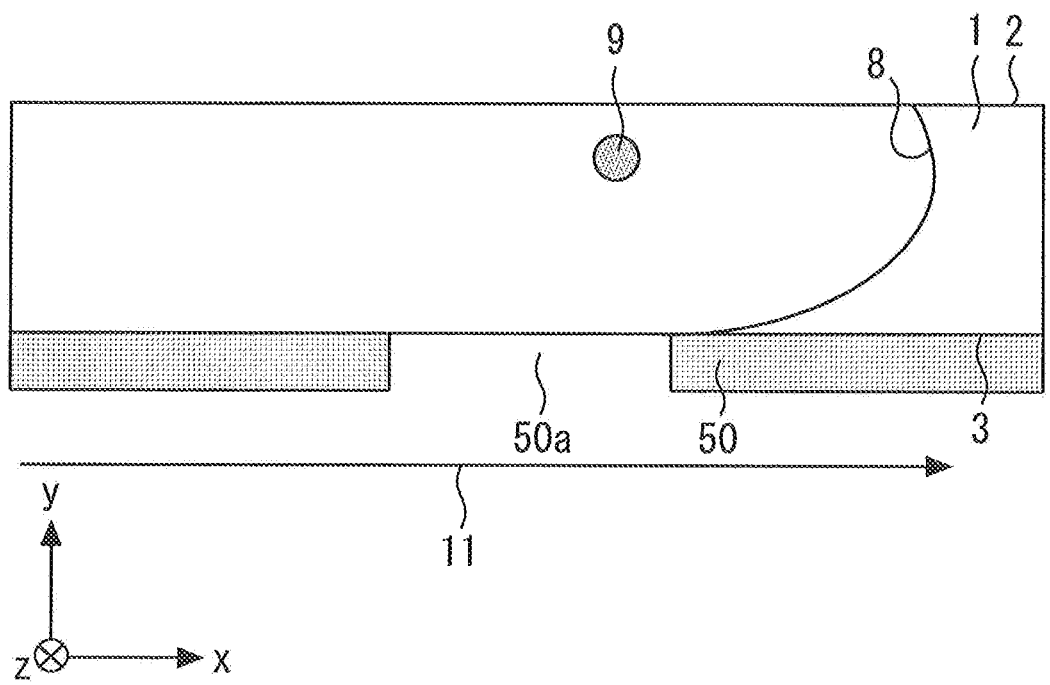
FIG. 13 shows a part of the sectional surface of the wafer that appears by cleavage according to Embodiment 5.

FIG. 13 shows a part of the sectional surface 4 of the wafer 1 that appears by cleavage according to Embodiment 5. The difference from Embodiment 4 is that multiple structures 50 are formed on the lower surface 3 of the wafer 1. In the cleaving step, the wafer 1 is cleaved from the lower surface 3 of the wafer 1. As described above, by allowing the step 8 to develop from the lower surface 3 of the wafer 1, the step is not likely to be formed in the active region 9 residing nearer to the upper surface 2 of the wafer 1.

Embodiment 6

Figure 14:
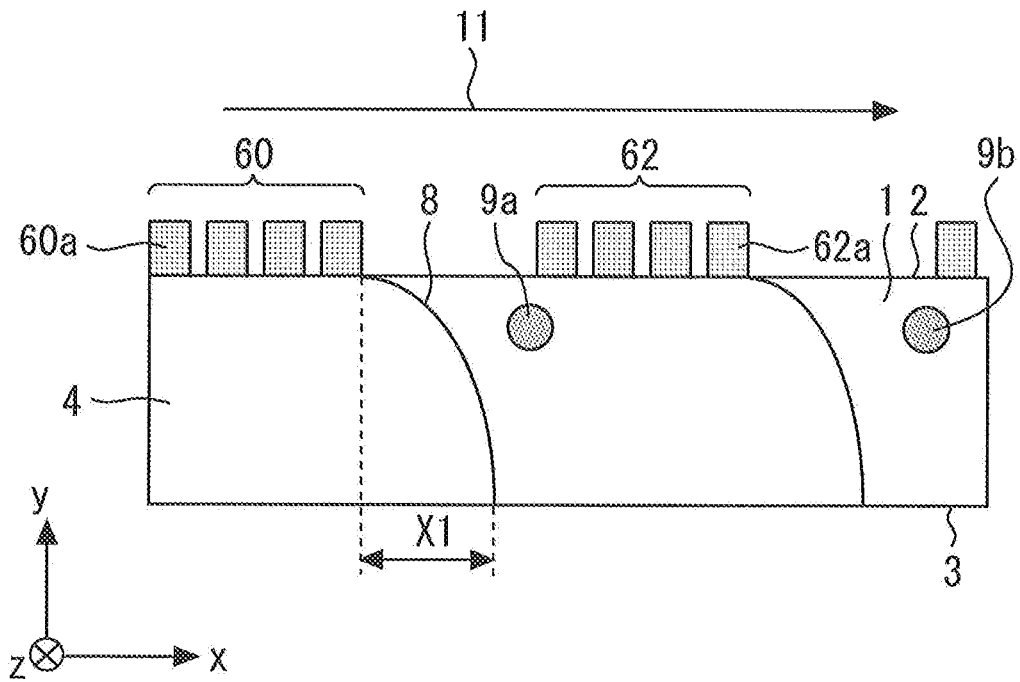
FIG. 14 shows a part of the sectional surface of the wafer that appears by cleavage according to Embodiment 6.

FIG. 14 shows a part of the sectional surface 4 of the wafer 1 that appears by cleavage according to Embodiment 6. The method for manufacturing a semiconductor device according to Embodiment 6 forms multiple structure groups on the upper surface 2 of the wafer 1 after the device formation step. The structure group means structures provided in a manner of multiple series. One structure group 60 includes multiple structures 60*a*. Another structure group 62 includes multiple structures 62*a*. Three or more structure groups may be formed. The material of the structure groups 60 and 62 may be metal or an insulating film, for example.

After the structure groups 60 and 62 are formed, the processing is advanced to the cleaving step. In the cleaving step, the wafer 1 is cleaved from the upper surface 2 of the wafer 1. In the regions with the structure groups 60 and 62, the structure groups 60 and 62 prevent the cleavage from propagating. Accordingly, the cleavage propagation speed decreases. In the regions without the structure groups 60 and 62, the cleavage propagation speed increases. The cleavage speed sharply increases at timing when the cleavage propagates from certain regions with the structure groups 60 and 62 to regions without the structure groups 60 and 62. When the cleavage propagation speed is high, the distance where the cleavage line moves in the cleavage reference line increases. That is, the amount of correction increases. Accordingly, the cleavage propagating amount required until completion of correction of the cleavage line decreases. Referring to FIG. 14, the length X1 of the step 8 in the cleavage propagation direction relatively decreases.

In Embodiment 6, an active region 9*a* is provided at a position more apart from the structure group 60 in the cleavage propagation direction than the length X1, and an active region 9*b* is provided at a position more apart from the structure group 62 in the cleavage propagation direction than the length X1. Accordingly, the steps 8 that develop from the structure groups 60 and 62 can be prevented from reaching the active regions 9*a* and 9*b*. The length X1 is smaller than the length of the step in the cleavage propagation direction in Embodiments 1 to 5 described above. Accordingly, the adverse effect of providing the active regions 9*a* and 9*b* in the cleavage propagation direction compared to the structure groups 60 and 62 is low.

After the cleaving step is completed, the steps 8 formed by the structure groups, and the multiple active regions 9*a* and 9*b* are exposed on the cleavage surface. In FIG. 14, one active region resides on a side of cleavage propagation with respect to one step 8. In a plan view, the step 8 is provided between the adjacent two structure groups 60 and 62 among the multiple structure groups. By providing the active regions 9*a* and 9*b* at the positions more apart from the structure groups 60 and 62 in the cleavage propagation direction than the length X1, the steps 8 can be prevented from reaching the active regions 9*a* and 9*b*.

Embodiment 7

Figure 15:
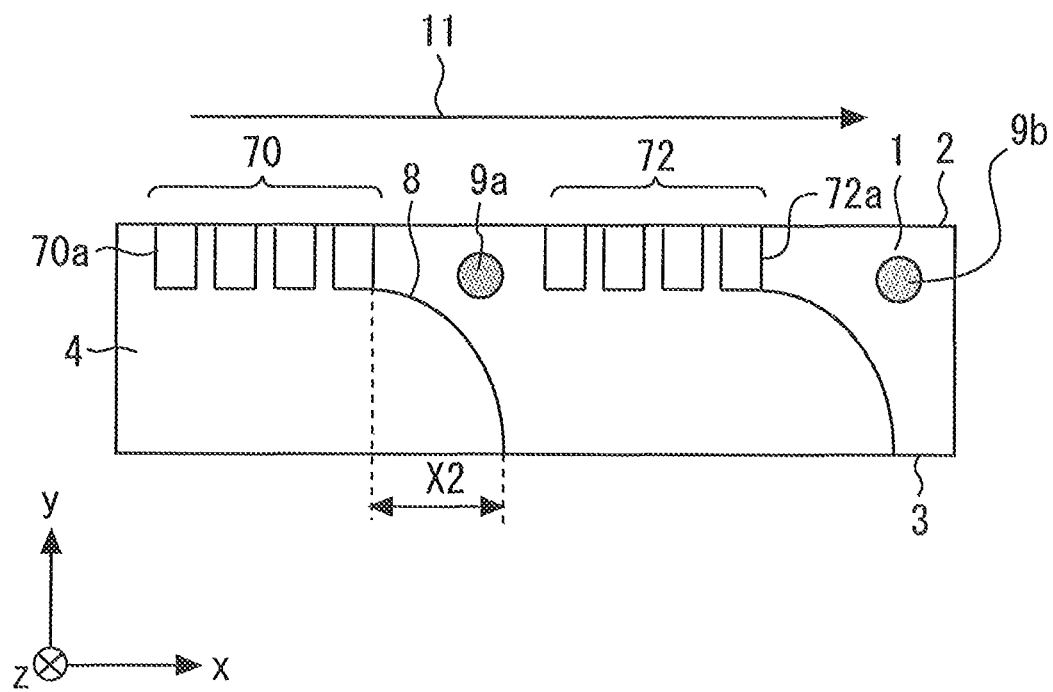
FIG. 15 shows a part of the sectional surface of the wafer that appears by cleavage according to Embodiment 7.

FIG. 15 shows a part of the sectional surface 4 of the wafer 1 that appears by cleavage according to Embodiment 7. Embodiment 7 forms multiple cleavage groove groups instead of the multiple structure groups in Embodiment 6. The method for manufacturing a semiconductor device according to Embodiment 7 forms multiple cleavage groove groups on the upper surface 2 of the wafer 1 after the device formation step. The cleavage groove group means structures provided in a manner of multiple series. One cleavage groove group 70 includes multiple cleavage grooves 70*a*. Another cleavage groove group 72 includes multiple cleavage grooves 72*a*. Three or more cleavage groove groups may be formed.

After the multiple cleavage groove groups are formed, the processing is advanced to the cleaving step. In the cleaving step, the wafer 1 is cleaved from the upper surface 2 of the wafer 1. In this case, in the regions with the cleavage groove groups 70 and 72, the cleavage groove groups 70 and 72 prevent the cleavage from propagating. Accordingly, the cleavage propagation speed decreases. In the regions without the cleavage groove groups 70 and 72, the cleavage propagation speed increases. The cleavage speed sharply increases at timing when the cleavage propagates from certain regions with the cleavage groove groups 70 and 72 to regions without the cleavage groove groups 70 and 72. When the cleavage propagation speed is high, the distance where the cleavage line moves in the cleavage reference line increases. That is, the amount of correction increases. Accordingly, the cleavage propagating amount required until completion of correction of the cleavage line decreases. Referring to FIG. 15, the length X2 of the step 8 in the cleavage propagation direction decreases.

The active regions 9*a* and 9*b* are formed between a certain cleavage groove group and another cleavage groove group. For example, the active region 9*a* is formed between the cleavage groove group 70 and the cleavage groove group 72. Preferably, the active regions 9*a* and 9*b* are provided above the bottoms of the cleavage groove groups 70 and 72. By providing the active region between the two cleavage groove groups, the steps that develop from the cleavage groove groups can be prevented from reaching the active regions. The length X2 is smaller than the length of the step in the cleavage propagation direction in Embodiments 1 to 5 described above. Accordingly, the adverse effect of providing the active regions in the cleavage propagation direction compared to the cleavage groove group is low. Irrespective of the groove depths of the cleavage groove groups 70 and 72, the active regions 9*a* and 9*b* can be provided.

In the configuration that includes the cleavage groove groups 70 and 72, the active region may be provided in the semicircle described in Embodiment 1. However, in this case, the deeper the cleavage groove is, the smaller the semicircle is. If the cleavage groove is deep, the positions where the active regions are provided are considerably limited. Preferably, the active regions 9a and 9b are provided between a certain cleavage groove group and another cleavage groove group. Alternatively, the active regions may be provided at positions more apart from the respective cleavage groove groups in the cleavage propagation direction than the length X2.

After the cleaving step is completed, the steps 8 formed by the cleavage groove groups 70 and 72, and the multiple active regions 9a and 9b are exposed on the cleavage surface. In FIG. 15, one active region resides on a side of cleavage propagation with respect to one step 8. The active region is provided between adjacent two cleavage groove groups among the multiple cleavage groove groups. By providing the active regions at the positions more apart from the cleavage groove groups in the cleavage propagation direction than the length X2, the steps can be prevented from reaching the active regions.

Note that the characteristics of Embodiments described above may be combined to improve the advantageous effects.

DESCRIPTION OF SYMBOLS

1 wafer, 2 upper surface, 3 lower surface, 4 sectional surface, 7 cleavage grooves, 8 steps, 9 active region

The invention claimed is:

1. A method for manufacturing a semiconductor device, comprising:
   forming a plurality of semiconductor devices having active regions, in a wafer;
   forming a plurality of cleavage grooves on an upper surface side of the wafer; and
   cleaving the wafer from the upper surface side of the wafer to expose steps formed by the plurality of cleavage grooves, and the plurality of active regions, on a sectional surface,
   wherein the active region is provided only in a semicircle that has a radius that is a distance from a bottom of the cleavage groove to a lower surface of the wafer, and has a center that is on the lower surface of the wafer and is immediately below the cleavage groove in a cleavage propagation direction.

2. The method for manufacturing a semiconductor device according to claim 1, wherein the active region is provided immediately below the cleavage groove.

3. The method for manufacturing a semiconductor device according to claim 1,
   wherein the cleavage groove has a width that becomes narrower in a depth direction, and
   the center of the semicircle is on the lower surface of the wafer immediately below an end of the cleavage groove in the cleavage propagation direction at a position with a narrowest width.

4. The method for manufacturing a semiconductor device according to claim 3, wherein the cleavage groove has a width that becomes narrower in a stepwise manner in the depth direction.

5. The method for manufacturing a semiconductor device according to claim 3, wherein a side surface of the cleavage groove is a curved surface at least partially.

6. A method for manufacturing a semiconductor device, comprising:
   forming a plurality of semiconductor devices having active regions, in a wafer, the active regions are formed on an upper surface side of the wafer;
   forming a plurality of cleavage grooves on a lower surface side of the wafer; and
   cleaving the wafer from the lower surface side of the wafer to expose steps formed by the plurality of cleavage grooves, and the plurality of active regions, on a sectional surface,
   wherein the active region is formed at a position that does not overlap the steps, and
   wherein the cleavage groove has a width that becomes narrower in a stepwise manner in the depth direction.

7. The method for manufacturing a semiconductor device according to claim 6, wherein the wafer includes, sequentially from the lower surface: a substrate; a lower clad layer; the active region, an upper clad layer, and a contact layer.

8. A method for manufacturing a semiconductor device, comprising:
   forming a plurality of semiconductor devices having active regions, in a wafer;
   forming a plurality of structures on an upper surface side of the wafer; and
   exposing steps formed by the plurality of structures, and the plurality of active regions, on a sectional surface, by cleaving the wafer from an upper surface side of the wafer
   wherein the active region is formed at a position that does not overlap the steps, and
   wherein the active region is provided only in a semicircle that has a radius that is a thickness of the wafer, and has a center that is on a lower surface of the wafer and is immediately below one of the plurality of structures in a cleavage propagation direction.

* * * * *